(12) United States Patent
Swihart et al.

(10) Patent No.: US 10,642,157 B2
(45) Date of Patent: *May 5, 2020

(54) AQUEOUS PROCESSING METHOD FOR FLEXOGRAPHIC PRINTING PLATES

(71) Applicant: MIRACLON CORPORATION, Oakdale, MN (US)

(72) Inventors: Donald L. Swihart, Stillwater, MN (US); Fredrick Charles Mellema, Oakdale, MN (US); David Edgar Brown, St. Paul, MN (US); M. Zaki Ali, Mendota Heights, MN (US)

(73) Assignee: MIRACLON CORPORATION, Oakdale, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/422,518

(22) Filed: May 24, 2019

(65) Prior Publication Data

US 2019/0278183 A1  Sep. 12, 2019

Related U.S. Application Data

(63) Continuation of application No. 15/196,122, filed on Jun. 29, 2016, now Pat. No. 10,324,378.

(51) Int. Cl.
*G03F 7/30* (2006.01)
*G03F 7/20* (2006.01)
(Continued)

(52) U.S. Cl.
CPC .............. *G03F 7/3092* (2013.01); *G03F 7/20* (2013.01); *G03F 7/305* (2013.01); *G03F 7/3042* (2013.01);
(Continued)

(58) Field of Classification Search
CPC ........................................................ G03F 7/00
See application file for complete search history.

(56) References Cited

U.S. PATENT DOCUMENTS 5,124,736 A  6/1992 Yamamoto et al.
5,506,086 A  4/1996 Van Zoeren
(Continued)

FOREIGN PATENT DOCUMENTS

DE    3503974 A1  8/1986
EP    0586470 B1  3/1998
(Continued)

*Primary Examiner* — Chanceity N Robinson
(74) *Attorney, Agent, or Firm* — Maschoff Brennan

(57) ABSTRACT

A method for processing a photosensitive flexographic printing plate having an aqueous-processable photopolymer. A main processing unit is used to develop a relief image by removing unexposed photopolymer using an aqueous processing solution including a first dispersing agent while the photosensitive flexographic printing plate is being subjected to mechanical cleaning. Used aqueous processing solution containing the removed photopolymer is returned back into a processing solution tank. A secondary processing unit is used to wash the developed relief image with secondary aqueous processing solution including a second dispersing agent to remove debris from the developed relief image. Used secondary aqueous processing solution containing the removed photopolymer is directed into the processing solution tank. A portion of the aqueous processing solution from the processing solution tank is removed to keep a volume of aqueous processing solution in the processing solution tank below a predefined maximum volume.

14 Claims, 8 Drawing Sheets

(51) Int. Cl.
*G03F 7/32* (2006.01)
*G03F 7/40* (2006.01)

(52) U.S. Cl.
CPC .......... *G03F 7/3057* (2013.01); *G03F 7/3071* (2013.01); *G03F 7/32* (2013.01); *G03F 7/405* (2013.01)

(56) References Cited

U.S. PATENT DOCUMENTS

| | | | |
|---|---|---|---|
| 5,828,923 A * | 10/1998 | Harabin | C02F 1/283 396/626 |
| 6,247,856 B1 | 6/2001 | Shibano et al. | |
| 7,371,023 B2 * | 5/2008 | Chan | B08B 3/14 396/611 |
| 8,142,987 B2 | 3/2012 | Ali et al. | |
| 8,399,177 B2 | 3/2013 | Stolt et al. | |
| 8,444,333 B2 | 5/2013 | Suzuki et al. | |
| 8,492,449 B2 | 7/2013 | Inoue et al. | |
| 8,945,813 B2 | 2/2015 | Kidnie | |
| 9,005,884 B2 | 4/2015 | Yawata et al. | |
| 9,250,527 B2 | 2/2016 | Kidnie | |
| 2009/0013888 A1 * | 1/2009 | Danon | B41N 3/08 101/423 |
| 2013/0095432 A1 | 4/2013 | Dietz | |

FOREIGN PATENT DOCUMENTS

| | | | |
|---|---|---|---|
| EP | 0586483 B1 | 11/1998 | |
| JP | H07-333861 A | 12/1995 | |
| JP | 2011033773 A | 2/2011 | |
| WO | 92/22015 A1 | 12/1992 | |
| WO | 2014/114900 A2 | 7/2014 | |

* cited by examiner

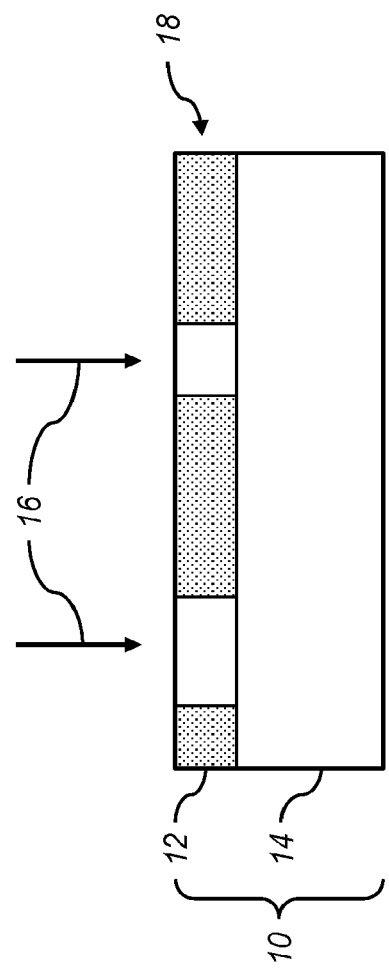

Baseline Example For Comparison

| Plate # | Dispersing Agent in Processing Solution Tank (Mass %) | Dispersing Agent in Secondary Processing Solution (Mass %) | Solution Volume for Secondary Processing per Plate (liters) | Polymer in Processing Solution Tank (Mass %) | Ratio of Polymer/ Dispersing Agent in Processing Solution Tank | pH in Processing Solution Tank | # Debris Artifacts ≥12μm | # Large Debris Artifacts ≥50μm | Overall Processing System Cleanliness |
|---|---|---|---|---|---|---|---|---|---|
| 0 | 0.87 | N/A | N/A | 0 | 0 | 10.10 | N/A | N/A | Excellent |
| 5 | 0.87 | N/A | 12 | 1.40 | 2.8 | 9.86 | 13 | 1 | Good |
| 12 | 0.87 | N/A | 12 | 3.20 | 6.1 | 9.58 | 29 | 3 | Poor |
| 14 | 0.87 | N/A | 12 | 4.00 | 7.1 | 9.45 | 43 | 10 | Poor |

FIG. 3A (Prior Art)

Inventive Example #1

| Plate # | Dispersing Agent in Processing Solution Tank (Mass %) | Dispersing Agent in Secondary Processing Solution (Mass %) | Volume Secondary Processing Solution per Plate (liters) | Polymer in Processing Solution Tank (Mass %) | Ratio of Polymer/Dispersing Agent in Processing Solution Tank | pH in Processing Solution Tank | # Debris Artifacts ≥12μm | # Large Debris Artifacts ≥50μm | Overall Processing System Cleanliness |
|---|---|---|---|---|---|---|---|---|---|
| 0 | 0.87 | 1.75 | N/A | 0 | 0 | 10.28 | N/A | N/A | Excellent |
| 1 | 0.97 | 1.75 | 15 | 0.25 | 0.26 | 10.24 | 0 | 0 | Excellent |
| 6 | 1.32 | 1.75 | 15 | 1.14 | 0.86 | 10.26 | 0 | 0 | Excellent |
| 12 | 1.55 | 1.75 | 15 | 1.70 | 1.10 | 10.34 | 0 | 0 | Excellent |
| 16 | 1.62 | 1.75 | 15 | 1.90 | 1.17 | 10.39 | 0 | 0 | Excellent |
| 26 | 1.70 | 1.75 | 15 | 2.10 | 1.25 | 10.30 | 2 | 0 | Excellent |
| 31 | 1.71 | 1.75 | 15 | 2.18 | 1.27 | 10.25 | 0 | 0 | Excellent |
| 41 | 1.73 | 1.75 | 15 | 2.22 | 1.28 | 10.29 | 0 | 0 | Excellent |
| 49 | 1.74 | 1.75 | 15 | 2.23 | 1.28 | 10.20 | 0 | 0 | Excellent |

FIG. 3B

Inventive Example #2

220

| Plate # | Dispersing Agent in Processing Solution Tank (Mass %) | Dispersing Agent in Secondary Processing Solution (Mass %) | Volume Secondary Processing Solution per Plate (liters) | Polymer in Processing Solution Tank (Mass %) | Ratio of Polymer/ Dispersing Agent in Processing Solution Tank | pH in Processing Solution Tank | # Debris Artifacts ≥12μm | # Large Debris Artifacts ≥50μm | Overall Processing System Cleanliness |
|---|---|---|---|---|---|---|---|---|---|
| 0 | 0.87 | 0.87 | N/A | 0 | 0 | 10.49 | N/A | N/A | Excellent |
| 16 | 0.87 | 0.87 | 15 | 1.90 | 2.18 | 9.88 | 0 | 0 | Very Good |

*FIG. 3C*

Inventive Example #3

230

| Plate # | Dispersing Agent in Processing Solution Tank (Mass %) | Dispersing Agent in Secondary Processing Solution (Mass %) | Volume Secondary Processing Solution per Plate (liters) | Polymer in Processing Solution Tank (Mass %) | Ratio of Polymer/ Dispersing Agent in Processing Solution Tank | pH in Processing Solution Tank | # Debris Artifacts ≥12μm | # Large Debris Artifacts ≥50μm | Overall Processing System Cleanliness |
|---|---|---|---|---|---|---|---|---|---|
| 0 | 0.87 | 2.61 | N/A | 0 | 0 | 9.9 | N/A | N/A | Excellent |
| 16 | 2.05 | 2.61 | 10 | 2.40 | 1.17 | 10.11 | 1 | 0 | Excellent |

*FIG. 3D*

AQUEOUS PROCESSING METHOD FOR FLEXOGRAPHIC PRINTING PLATES

CROSS-REFERENCE TO RELATED APPLICATIONS

This patent application is a continuation application of U.S. patent application Ser. No. 15/196,122 filed Jun. 29, 2016, which is incorporated herein by specific reference in its entirety.

FIELD OF THE INVENTION

This invention pertains to the field of flexographic printing, and more particularly to an aqueous processing method for flexographic printing plates.

BACKGROUND OF THE INVENTION

Relief printing plates, such as flexographic plates, falls into two main categories: (1) those that are processed using aqueous solutions to remove unexposed photopolymer, and (2) those that need to be processed using some other chemical solvent. In recent years, flexographic printing plates using an aqueous-processable photopolymer are gaining more market interest because of their environmentally-friendly characteristics. They have the additional advantage that they can reduce organic solvent exposure at the workplace. Aqueous-processable printing plates are sometimes referred to as aqueous-washable printing plates because the processing typically involves washing off the unexposed photopolymer.

There are also two main types of aqueous-processable flexographic printing plates: (1) those that are processable by dissolution of the photopolymer using a strong alkaline solution (i.e., having a pH>11), and (2) those that are processable by dispersion of the photopolymer using a processing solution including a dispersing agent (typically having a pH<11).

Aqueous-processable flexographic printing plates may be processed (i.e., "washed") by a number of methods. For example, U.S. Pat. No. 5,124,736 (Yamamoto et al.), entitled "Process and apparatus for developing photopolymer plate," describe systems which form the relief by spraying processing solution (i.e., "washout solution") under pressure onto the printing plate, and systems which form the relief by rubbing a brush against the printing plate in the presence of the processing solution, thereby dissolving the unexposed portions in the processing solution. Yamamoto et al., describe a system in which processing solution is filtered and recirculated to the plate processor after a full batch of platemaking.

As noted by U.S. Pat. No. 6,247,856 (Shibano et al.), entitled "Developing system of photosensitive resin plates and apparatus used therein," photopolymer (i.e., resin) can build up in the used processing solution after processing a number of printing plates. This can cause various problems, such as decreasing the speed of development, and the dispersed resin forming scum which adheres to the plates and the brush. This can require frequent disposal of the used processing solution and preparation of a fresh processing solution. Shibano et al. discloses the addition of fresh processing solution to a processing unit, while removing part of the resin-containing processing solution to keep the resin content of the processing solution substantially constant.

In order to remove debris that becomes attached to the surface of the printing plate, a rinsing station can be employed after the main plate processing step. U.S. Patent Application Publication No. 2009/0013888 (Danon), entitled "Methods and means relating to photopolymer printing plates," discloses processing a printing plate using a processing solution, followed by rinsing with water in a rinsing station. Used processing solution is recycled back to the processor after filtration. Waste water from the rinsing station may also be recycled back to the processor after filtration.

U.S. Pat. No. 5,828,923 (Harabin et al.), entitled "Apparatus and method for processing water wash photopolymer solution," disclose directing used processing solution into a holding tank, and adding a coagulant to coagulate the solid content for disposal.

European Patent 0586470B1 (Danon), entitled "Preparation of photopolymerised elastomeric printing plates" disclose a processing system including (a) a wash-out section where unexposed areas of the plate are removed; (b) a rinse section; (c) an excess water-removing section; (d) a light-finishing section where the plate is exposed by UV light to reduce the stickiness of the plate surface; and (e) a drying section.

European patent 0586483B1 (Danon), entitled "Method and Apparatus for washing-out printing plates," discloses a system for processing printing plates where processing solution is directed through a spray bar along downwardly directed bristles of a washout brush.

It has been found that even when utilizing a plate processor that includes a rinse operation, such as that disclosed in the aforementioned U.S. Patent Application Publication No. 2009/0013888, there can still be significant problems with plate defects after the production of only a few plates. The occurrence of plate defects is particularly problematic with the increasingly popular photopolymer plates with include micro-texture on the raised plate surface (i.e., the printing surface). As discussed in U.S. Pat. No. 8,399,177 (Stolt et al.), entitled "Enhanced printing plate," the micro-texture is beneficial to enhance print density and uniformity. In such cases, the debris particles tend to accumulate on the micro-texture surface of the printing plate, which results in unacceptable print defects after processing a small number of printing plates.

There remains a need for an improved aqueous processing method for flexographic printing plates that enables processing a larger number of defect-free printing plates before it is necessary to replace the used processing solution.

SUMMARY OF THE INVENTION

The present invention represents a method for processing a photosensitive flexographic printing plate having a latent image formed by image-wise exposure of an aqueous-processable photopolymer, including:

using a main processing unit to develop the latent image into a relief image by removing unexposed photopolymer from the photosensitive flexographic printing plate by contacting the photosensitive flexographic printing plate with an aqueous processing solution including a first dispersing agent while the photosensitive flexographic printing plate is being subjected to mechanical cleaning, wherein the aqueous processing solution is supplied to the main processing unit from a processing solution tank, and wherein used aqueous processing solution containing the removed photopolymer is returned from the main processing unit back into the processing solution tank;

using a secondary processing unit to wash the developed relief image with a secondary aqueous processing solution including a second dispersing agent to remove debris from the developed relief image, wherein unused secondary aqueous processing solution is provided to the secondary processing unit, and wherein used secondary aqueous processing solution containing the removed photopolymer is directed from the secondary processing unit into the processing solution tank; and removing a portion of the aqueous processing solution from the processing solution tank to keep a volume of aqueous processing solution in the processing solution tank below a predefined maximum volume;

wherein a concentration of photopolymer in the aqueous processing solution in the processing solution tank is maintained below a predefined maximum photopolymer concentration.

This invention has the advantage that the quality of aqueous-processable printing plates is improved by more effective removal polymer particulates and debris that can cause print defects from the surface of the printing plate.

It has the further advantage that the productivity of plate making is improved by extending the number of defect-free printing plates that can be produced before a complete clean-out of the plate processor is required.

It has the additional benefit is the processing unit and holding tank are maintained in a cleaner state, which requires a shorter time for a thorough clean-out of the plate processor.

BRIEF DESCRIPTION OF THE DRAWINGS

FIGS. 1A-1D illustrate the steps involved with forming a flexographic printing plate according to an exemplary process;

FIG. 3A shows a table summarizing the results of an experiment to characterize the performance of a prior art processing system; and FIGS. 3B-3D show tables summarizing the results of experiments used to characterize processing systems using embodiments of the present invention.

It is to be understood that the attached drawings are for purposes of illustrating the concepts of the invention and may not be to scale. Identical reference numerals have been used, where possible, to designate identical features that are common to the figures.

DETAILED DESCRIPTION OF THE INVENTION

Figure 1B:
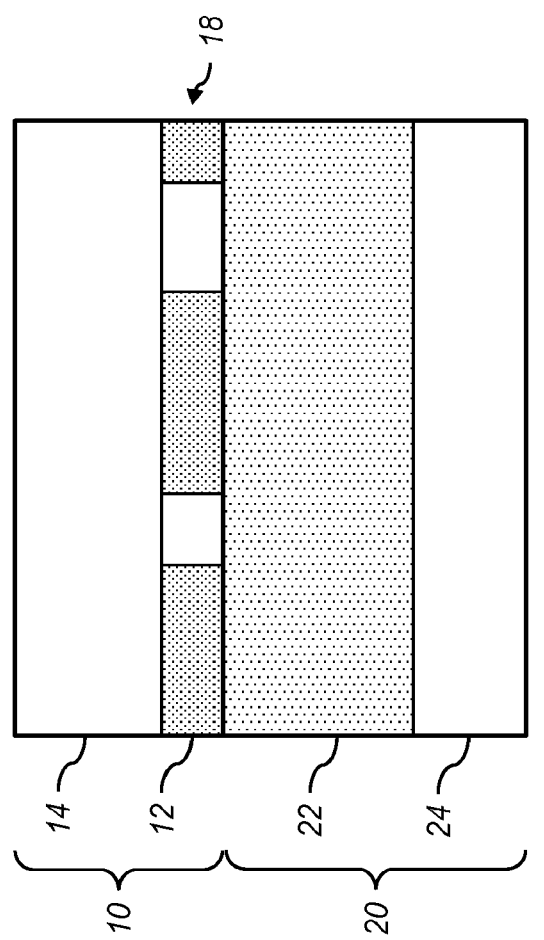

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are not mutually exclusive, unless so indicated or as are readily apparent to one of skill in the art. The use of singular or plural in referring to the "method" or "methods" and the like is not limiting. It should be noted that, unless otherwise explicitly noted or required by context, the word "or" is used in this disclosure in a non-exclusive sense.

In accordance with the present invention, flexographic printing plates are formed by applying an aqueous processing solution to photosensitive flexographic printing plate precursors having latent images formed in an aqueous-processable photopolymer. In an exemplary embodiment, the photosensitive flexographic printing plates are similar to those described in U.S. Pat. No. 8,492,449 No. (Inoue et al.), entitled "Photosensitive resin composition, printing plate precursor and flexographic printing plate." However, the described processing system and method is applicable to other types of aqueous-processable printing plates, including other types of aqueous-processable relief printing plates (e.g., letterpress printing plates).

Before processing, a latent image is formed on the photosensitive flexographic printing plate using any appropriate method known in the art. In an exemplary embodiment, the latent image is formed using a mask image as described in commonly-assigned U.S. Pat. No. 9,250,527 (Kidnie), entitled "Mask forming imageable material and use," which is incorporated herein by reference. This method is illustrated in FIGS. 1A-1D.

FIG. 1A illustrates a mask material 10, which includes a mask layer 12 on a substrate 14. In an exemplary embodiment, the mask material 10 is the commercially-available Kodak Flexcel NX Thermal Imaging Layer material. Further information about such mask materials 10 can be found in the aforementioned U.S. Pat. No. 9,250,527. The mask layer 12 is opaque to the radiation that will be used to expose the photosensitive flexographic printing plate (e.g., to UV radiation). The mask material 10 is exposed to radiation 16 in an image-wise fashion to form a mask image 18 in the mask layer 12. The mask image 18 will typically include patterns of halftone dots, lines, text and solid areas (with or without micro-surface patterning) according to the image content to be printed. In an exemplary embodiment, the radiation 16 is provided by a commercially-available Kodak Trendsetter NX Imager, which uses an infrared laser to ablate portions of the mask layer 12 where it is desired to produce raised features on the flexographic printing plate.

As illustrated in FIG. 1B, the mask material 10 is now laminated to a photosensitive printing plate 20. The photosensitive printing plate 20 includes a photosensitive photopolymer layer 22 over a substrate 24. The mask material 10 is laminated such that the mask layer 12 having the mask image 18 faces the photopolymer layer 22. In an exemplary embodiment, the photosensitive printing plate 20 is of a type similar to those described in the aforementioned U.S. Pat. No. 8,492,449 (Inoue et al.) (except that no antiadhesive layer is included over the photopolymer layer), and the lamination is performed (after removing the cover film from the photosensitive printing plate 20) using a commercially-available Kodak Flexcel NX laminator so that the mask material 10 is in an intimate contact with the photopolymer layer 22 of the photosensitive printing plate 20.

Figure 1C:
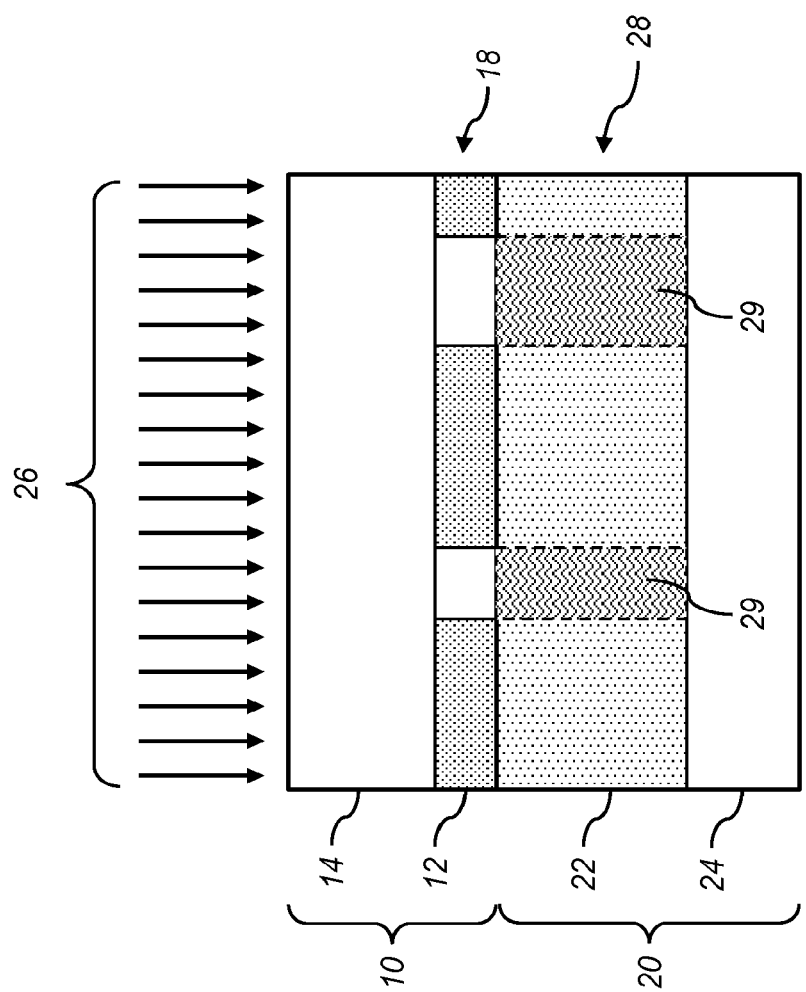

In FIG. 1C, the laminated photosensitive printing plate 20 is exposed to radiation 26 to form a latent image 28 in the photopolymer layer 22. Various commercially available UV exposure devices may be used to perform this operation. In an exemplary embodiment, the radiation 26 is UV radiation supplied by a commercially-available Concept 302 EDLF system available from Mekrom Engineering. Where the mask image 18 has been ablated, the radiation 26 passes through the mask layer 12 and exposes the photopolymer layer 22, thereby cross-linking and hardening the photopolymers to provide a developable latent image 28 including cross-linked polymer regions 29. The UV exposure 26 can be provided at a wide range of temperatures from about room temperature up to 60 C. However, it has been found that UV radiation exposure performed at elevated temperatures in the range of 42 C-52° C. provides better final plate quality (e.g., improved minimum dot holding and better resolution of surface micro-textures).

Figure 1D:
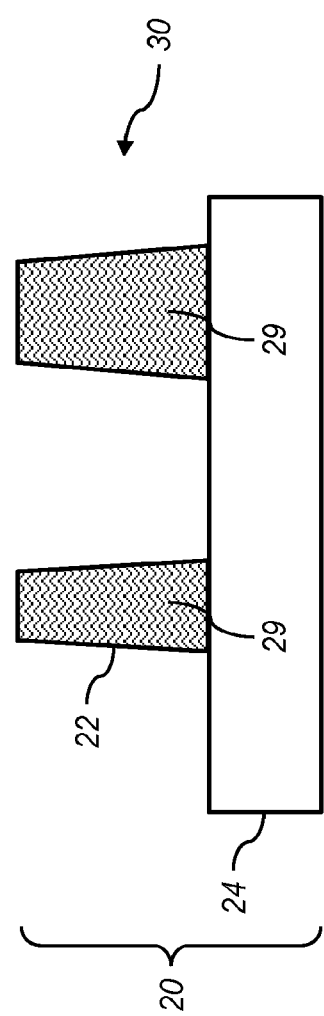

After the latent image 28 has been formed, the mask material 10 is removed, and the photosensitive printing plate 20 is processed to provide a developed relief image 30 as illustrated in FIG. 1D. The processing operation (sometimes referred to as "developing the printing plate") involves removing the unexposed portions of the photopolymer layer where were not hardened by the radiation 26 (FIG. 1C) leaving the cross-linked polymer regions 29. In accordance with the present invention, the photopolymer layer 22 is made of an aqueous-processable photopolymer so that the processing operation uses an aqueous processing solution (i.e., a water-based processing solution), typically including an active ingredient such as a dispersing agent. Aqueous processing solutions are generally preferred to processing solutions using other solvents (e.g., organic solvents) because of their environmentally-friendly characteristics.

Figure 2:
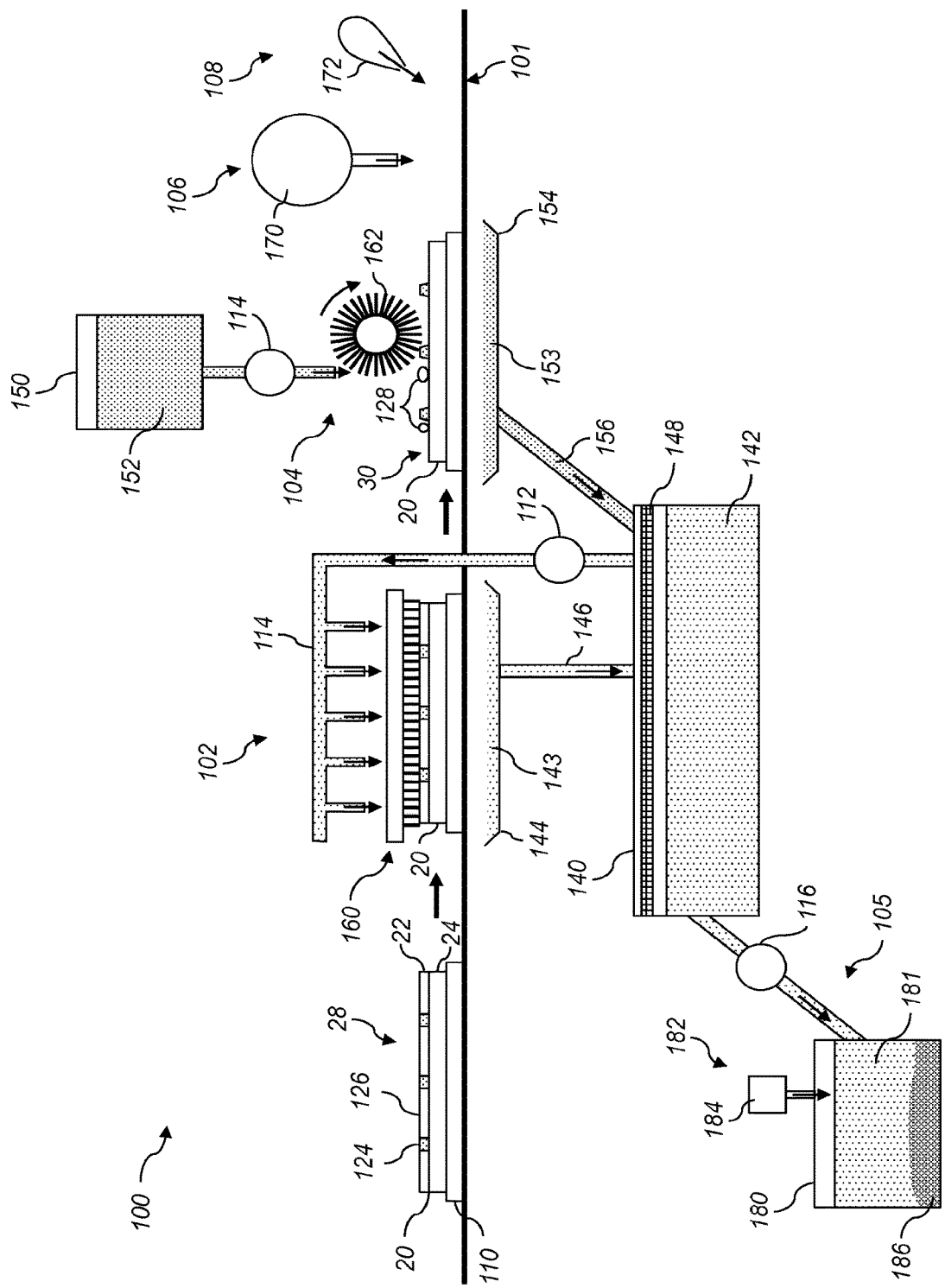
FIG. 2 shows a schematic diagram of a system for processing a photosensitive flexographic printing plate according to an exemplary embodiment.

FIG. 2 shows a schematic diagram of an exemplary processing system 100 for processing an aqueous-processable photosensitive printing plate 20 in accordance with the present invention. In an exemplary embodiment, the photosensitive printing plate 20 is of a type similar to those described in the aforementioned U.S. Pat. No. 8,492,449 (Inoue et al.) (except that no antiadhesive layer is included over the photopolymer layer). However, other types of aqueous-processable printing plates can also be used.

In the exemplary arrangement of FIG. 2, the plate processing takes place as an "in-line process" where the photosensitive printing plate 20 proceeds through the processing system 100 along a processing path 101 where a series of processing operations are applied. In alternate embodiments, the plate processing can be performed as a "batch process", where after the main plate processing, the plate moves in the reverse direction and the secondary processing takes place similar to the in-line process.

In an exemplary arrangement, the photosensitive printing plate 20 is mounted on a platen 110 as it is moved along the processing path 101. The input to the processing system 100 is a photosensitive printing plate 20 having a latent image 28 formed by exposing the photopolymer layer 22. The latent image 28 includes exposed portions 124 where the photopolymer layer 22 has been hardened by exposure to appropriate actinic radiation, and unexposed portions 126 where the photopolymer layer 22 remains soft and is to be removed from the substrate 24 during processing.

Main processing unit 102 is used to develop the latent image 28 into a relief image 30 by removing the unexposed portions 126 of the photopolymer layer 22 from the photosensitive printing plate 20. The main processing unit 102 can also referred to as a processing station or a development unit/station. The main processing unit 102 includes a pump 112 for drawing aqueous processing solution 142 from a processing solution tank 140 and directing it through a series of pumps 114 to bring the aqueous processing solution 142 into contact with the photosensitive printing plate 20.

The aqueous processing solution 142 includes a dispersing agent (i.e., "soaps") to aid in the removal of the unexposed photopolymer. Any appropriate dispersing agent known in the art can be used in accordance with the present invention. Some examples of appropriate dispersing agents are discussed in U.S. Pat. No. 9,005,884 (Yawata et al.), entitled "Developer composition for printing plate, developer and method for manufacturing printing plate," which is incorporated herein by reference. In one example, the dispersing agent is a salt of an fatty acid, preferably having an average carbon number in the range of 10-20. In another example, the dispersing agent is a sulfonate, such as an alkylbenze sulfonate having an average carbon number in the range of 8-16, or an –α-olefin sulfonate having an average carbon number in the range of 10-20. In a preferred embodiment, the aqueous processing solution 142 is heated to a predetermined value between 40 C to 60 C.

In a preferred configuration, the main processing unit 102 includes a mechanical cleaning system 160 to aid in removing the unexposed photopolymer from the photosensitive printing plate 20. The mechanical cleaning system 160 typically includes one or more brushes which contact the photopolymer layer 22 of photosensitive printing plate 20 while it is in contact with the aqueous processing solution 142. The brushes are preferably moved relative to the photosensitive printing plate 20, for example in a side-to-side motion or an orbital motion.

Various brush configurations can be used in accordance with the present invention. For example, the brushes can be downward facing as shown in FIG. 2. Examples of downward-facing brush configuration are shown in European Patent No. 0586483B1, European Patent No. 0586470B1, and U.S. Pat. No. 8,444,333 (Suzuki et al.), each of which is incorporated herein by reference. Alternatively, the brushes can be upward facing such as in the configurations described in U.S. Pat. No. 5,124,736 (Yamamoto et al.) and U.S. Pat. No. 6,247,856 (Shibano et al.), each of which are incorporated herein by reference.

A collection system 144 is used to collect the used aqueous processing solution 143 and return it to the processing solution tank 140 through a conduit 146. The used aqueous processing solution 143 will contain the photopolymer that was removed from the unexposed portions 126 of the photopolymer layer 22. The used aqueous processing solution 143 is preferably passed through a filter 148 to remove larger particles of the removed photopolymer. In an exemplary embodiment, the filter 148 is a coarse fabric-type filter material having a pore size of about 100 μm similar to that described in WO 2014/114900 A2 (Danon), entitled "Processing waste washout liquid." In some configurations, the filter 148 is supplied in a roll format, and the filter material is advanced during operation of the processing system 100 to provide fresh filter material. The used filter material containing the photopolymer particles is collected on a take-up roll.

The main processing unit 102 removes the majority of the unexposed photopolymer from the photosensitive printing plate 20 to provide the relief image 30. However, it has been observed that debris 128 is typically present on the surface of the relief image 30. The debris 128 is primarily made up of residual particles of photopolymer that were not washed off the surface of the photosensitive printing plate 20.

A secondary processing unit 104 is used to wash the developed relief image 30 with a secondary aqueous processing solution 152 supplied from a supply tank 150 to remove the remaining debris 128. The secondary processing unit 104 can also be referred to as a secondary processing station, a secondary developing unit/station or a washing unit/station. Preferably, a pump 114 is used to direct the secondary aqueous processing solution 152 onto the photosensitive printing plate 20 under pressure, bringing it into contact with the developed relief image 30.

In a preferred embodiment, an optional mechanical cleaning system 162, such as a rotating brush, is used to enhance the performance of the secondary processing unit 104 by supplementing the washing action of the secondary aqueous processing solution 152 with mechanical cleaning.

Some prior art systems, utilize a water rinsing operation to clean the surface of the developed relief image 30. However, rather than being a simple water rinse, the secondary aqueous processing solution 152 used in the secondary processing unit 104 of the present invention includes an active ingredient (i.e., a dispersing agent) to aid in the removal of the debris 128. The secondary aqueous processing solution 152 is unused, meaning that it has not previously been used to process a photosensitive printing plate 20 and therefore contains no photopolymer. It has been found that this substantially improves the effectiveness of removing the debris 128. In a preferred embodiment the secondary aqueous processing solution temperature is between 40 C-55 C.

Any appropriate dispersing agent can be used in the secondary aqueous processing solution 152 such as those that were discussed earlier relative to the aqueous processing solution 142. In an exemplary configuration, the dispersing agent in the secondary aqueous processing solution 152 is the same as the dispersing agent used in the aqueous processing solution 142 used in the main processing unit 102. In other configurations, the dispersing agent in the secondary aqueous processing solution 152 can be different than the dispersing agent used in the aqueous processing solution 142.

In an exemplary configuration, the concentration of the dispersing agent in the secondary aqueous processing solution 152 is the same as the initial concentration of the dispersing agent in the aqueous processing solution 142 used in the main processing unit 102. In other configurations, the concentration of the dispersing agent in the secondary aqueous processing solution 152 can be greater than (or less than) than the concentration of the dispersing agent in the aqueous processing solution 142.

A collection system 154 collects the used secondary aqueous processing solution 153 from the secondary processing unit 104 and directs it into the processing solution tank 140 through a conduit 156. This has the advantage that it replenishes the used aqueous processing solution 143 that can contain large amounts of photopolymer with the fresher used secondary aqueous processing solution 153 from the secondary processing unit 104 which will contain only small amounts of photopolymer (i.e., the removed debris 128).

A processing solution removal system 105 is used to remove aqueous processing solution 142 from the processing solution tank 140 and direct it into a holding tank 180. This enables the volume of the aqueous processing solution 142 in the processing solution tank 140 to be maintained below a predefined maximum volume as the used secondary aqueous processing solution 153 is added to the processing solution tank 140. In an exemplary configuration, the processing solution removal system 105 uses a pump 116 to pump the aqueous processing solution 142 from the processing solution tank 140 into the holding tank 180. Preferably, the amount of aqueous processing solution 142 removed from the processing solution tank 140 is equal to the amount of used secondary aqueous processing solution 153 that is added to the processing solution tank 140 so that the total volume of aqueous processing solution 142 in the processing solution tank 140 remains approximately constant. In some embodiments, the pump 116 is operated on a predefined schedule (e.g., after processing each photosensitive printing plate 20). In other embodiments, the pump 116 can be operated when it is detected that the volume of aqueous processing solution 142 in the processing solution tank 140 is detected to exceed a predefined threshold.

The removal of the aqueous processing solution 142 by the processing solution removal system 105 in combination with the addition of the used secondary aqueous processing solution 153 from the secondary processing unit 104 enables the concentration of photopolymer in the aqueous processing solution 142 in the processing solution tank 140 to be maintained below a predefined maximum photopolymer concentration. Without this replenishment process, it has been found that the concentration of the photopolymer in the aqueous processing solution 142 in the processing solution tank 140 quickly builds up to an unacceptable level which detrimentally effects the performance of the processing system 100 after only processing a few (e.g., five or less) photosensitive printing plates 20. However, using the described replenishment process it has been found that acceptable performance can be maintained even after processing a large number (e.g., more than 50) photosensitive printing plates 20.

The aqueous processing solution 142 operates optimally within a defined pH range. The presence of the photopolymer in the used aqueous processing solution 143 can change the pH of the solution thereby reducing its effectiveness. The described process including the removal of the aqueous processing solution 142 by the processing solution removal system 105 in combination with the addition of the used secondary aqueous processing solution 153 from the secondary processing unit 104 enables the pH of the aqueous processing solution 142 in the processing solution tank 140 to be maintained within a predefined acceptable pH range for processing a larger number of photosensitive printing plates 20.

In the exemplary processing system 100, after the photosensitive printing plate 20 has been processed by the secondary processing unit 104, it is rinsed using a rinsing unit 106 which directs a stream of water 170 onto the surface of the developed relief image 30. This water rinsing is used to remove any residual processing solution from the surface of the photosensitive printing plate 20. The photosensitive printing plate 20 is then dried using a drying unit 108. In an exemplary configuration, the drying unit 108 uses an air knife 172 to direct a stream of air onto the surface of the developed relief image 30.

At some point it is necessary to discard the waste processing solution 181 collected in the holding tank 180. In an exemplary configuration, a coagulant supply system 182 can be used to add an appropriate coagulant 184 to the waste processing solution 181 to coagulate the polymer in the waste processing solution 181. The resulting solid coagulated polymer 186 can then be removed from the solution and discarded in an appropriate manner. The remaining waste processing solution 181 can then be disposed of in most locations without any significant environmental concerns. Examples of coagulants 184 that can be used to produce the coagulated polymer 186 include Bentonite clay (such as commercially available RM-10 from Cetco), Alum (potassium aluminum sulphate), aluminum sulphate, strong acids (such as hydrochloric acid), ferric chlorides, and many other chemicals commonly used in waste water treatment. Bentonite Clay RM-10 is particularly preferred.

The effectiveness of the described processing method was tested by processing a series of photosensitive printing plates 20 and evaluating the results for artifacts. The photosensitive printing plates 20 were of a type similar to those described in the aforementioned U.S. Pat. No. 8,492,449 (Inoue et al.) (except that no antiadhesive layer is included over the photopolymer layer), and were 35×47 inches in size. The photosensitive printing plates 20 were exposed using the method described with respect to FIGS. 1A-1C to provide photosensitive printing plates 20 with latent images 28 corresponding to typical image content. The photosensitive printing plates 20 were then processed using an aqueous processing solution 142 for 3.5 minutes at 50° C. to remove the unexposed photopolymer, together with mechanical cleaning as described earlier. The used aqueous processing solution 143 containing the removed photopolymer was then returned to the processing solution tank 140 after filtering as discussed earlier with respect to FIG. 2. For this testing, the dispersing agent in the aqueous processing solution 142 was a commercially-available dishwashing detergent from Miyoshi Soap Corporation, whose active ingredients are salts of various long chain fatty acids. At various intervals, the processed photosensitive printing plates 20 were evaluated to determine the number of debris artifacts in two size ranges (≥12 μm and ≥50 μm).

FIG. 3A shows a table 200 summarizing the experimental results for a baseline test corresponding to a configuration where the same aqueous processing solution 142 (drawn from the processing solution tank 140) was used for both the main processing unit 102 and the secondary processing unit 104. The first column of the table 200 shows the number of processed photosensitive printing plates 20. The row for Plate #0 corresponds to the initial state before any plates were processed.

The second column of the table 200 shows the amount of dispersing agent in the aqueous processing solution 142 in the processing solution tank 140. In this example, the amount of dispersing agent stays at a constant level since no processing solution was added or removed from the processing solution tank 140.

Since the secondary processing unit 104 used the same aqueous processing solution 142 as the main processing unit 102, no secondary aqueous processing solution 152 was used as indicated by the "N/A" in the third column. The fourth column indicates that 12 liters of processing solution (in this case aqueous processing solution 142) was used by the secondary processing unit 104 to process each photosensitive printing plate 20. (The secondary processing unit 104 used 6 liters/minute for 2 minutes corresponding to the total solution volume of 12 liters.)

Over time, as more photosensitive printing plates 20 were processed, it can be seen that the amount of polymer in the processing solution tank 140 grew steadily (see column #5), as well as the ratios of the polymer to the dispersing agent (see column #6). The pH of the aqueous processing solution 142 in the processing solution tank 140 was gradually reduced over time (see column #7), which will have the result of decreasing the effectiveness of the processing.

The processed photosensitive printing plates 20 were dried, and post exposed in a conventional UV exposure and finishing process. The finished plates were then evaluated under a microscope to analyze defects related to debris particles measured at random locations on the plate. It can be seen that even after just processing five photosensitive printing plates 20, a significant number of debris artifacts were detected (see columns #8 and #9). Even a single large debris artifact would be unacceptable, so in the prior art configuration, the aqueous processing solution 142 would need to be discarded after processing less than five plates. Furthermore, the overall quality of cleanliness of the processing system (as evidenced by particulates attached to the sides of the machine, and on the brush surface) was evaluated (see column #10), and was found to decline rapidly.

FIGS. 3B-3D show results obtained according to the method of the present invention where the secondary aqueous processing solution 152 used by the secondary processing unit 104 is fresh solution that includes a dispersing agent, and where the used secondary aqueous processing solution 153 is added to the processing solution tank 140. In these examples, the amount of aqueous processing solution 142 removed from the processing solution tank 140 was equal to the amount of used secondary aqueous processing solution 153 that was added to the processing solution tank 140 so that the total volume of aqueous processing solution 142 in the processing solution tank 140 remained approximately constant.

In Example #1 summarized in table 210 of FIG. 3B, the concentration of the dispersing agent in the used secondary aqueous processing solution 153 (see column #3) is about 2× the initial concentration of the aqueous processing solution 142 in the processing solution tank 140 (see column #2). In this example, the secondary processing unit 104 used 7.5 liters/minute of used secondary aqueous processing solution 153 for 2 minutes for a total of 15 liters.) From column #2, it can be seen that over time, the concentration of dispersing agent in the aqueous processing solution 142 in the processing solution tank 140 gradually increases due to the addition of the used secondary aqueous processing solution 153, which has a higher dispersing agent concentration.

While the amount of polymer in the processing solution tank 140 (see column #5) increases over time, it does so at a much lower rate than it did in the prior-art configuration of FIG. 3A. Likewise, the ratio of the polymer to the dispersing agent (see column #6) also grows much more slowly. The pH of the aqueous processing solution 142 remains approximately constant in this case. The performance of the processing system 100 is substantially improved relative to the prior art as can be seen by the number of debris artifacts (see columns #8 and 9) and the processing system cleanliness (see column 10). Even after processing 49 printing plates, the number of debris artifacts was at an acceptable level.

The data of FIG. 3B demonstrates that the improved processing system 100 has the advantage that it can be operated for much longer periods of time before requiring that the aqueous processing solution 142 in the processing solution tank 140 be replaced with fresh solution. Whereas the prior art configuration of FIG. 3A could only be used to process a few printing plates, it has been found to be possible to process as many as 50 or more printing plates with the improved processing system 100.

FIG. 3C shows a table 220 summarizing the results obtained for an alternate configuration where the concentration of the dispersing agent in the used secondary aqueous processing solution 153 (see column #3) is the same as the initial concentration of the aqueous processing solution 142 in the processing solution tank 140 (see column #2, plate #0). As a result, the concentration of the dispersing agent in the aqueous processing solution 142 (see column #2) stays constant over time. The pH decreased slightly (see column #7) over time. In this case, no debris artifacts were found after processing 16 plates (see columns #8 and 9), and the overall system cleanliness was very good (see column 10).

FIG. 3D shows a table 230 summarizing the results obtained for an alternate configuration where the concentration of the dispersing agent in the secondary aqueous processing solution 153 (see column #3) is about 3× the initial concentration of the aqueous processing solution 142 in the processing solution tank 140 (see column #2, plate #0). In this case, the flow rate of the used secondary aqueous processing solution 153 was reduced to 5 liters/minute for 2 minutes so that a total of 10 liters of used secondary aqueous processing solution 153 were used (see column #4). (Below this flow rate, it was found that the used secondary aqueous processing solution 153 did not fully cover the plate for the tested configuration of the secondary processing unit 104. The minimum flow rate needed to fully cover the plate may vary depending on the size of the plate, and the type of active ingredient in the used secondary aqueous processing solution 153.) For this example, it can be seen that the concentration of the dispersing agent in the aqueous processing solution 142 (see column #2) gradually increased over time, and the pH increased slightly (see column #7). In this case, only a single small debris artifact was found after processing 16 plates (see columns #8 and 9), and the overall system cleanliness was excellent (see column 10).

Several finished photosensitive printing plates 20 corresponding to the tested configurations shown in FIGS. 3A-3D were also used to make prints in a flexographic printing press in order to analyze visible print defects corresponding to the debris on the photosensitive printing plates 20. It was found that visual mottle appearance and voids on the printed substrate increased with the number of debris particles and larger sizes of debris on the plate as would be expected. Samples from the comparative prior art example of FIG. 3A showed visible print defects only after processing only a few plates. In comparison, the photosensitive printing plates 20 processed in accordance with the present invention according to the exemplary configurations of FIG. 3B-3D showed no visible print defects resulting from debris particles on the plate.

Without excluding other reasonable explanations, it is hypothesized that the inventive plate processing method helps to more effectively clean the entire surface of the photosensitive printing plates 20 due to the addition of the active ingredient to the secondary aqueous processing solution 152 used in the secondary processing unit 104. Furthermore, the addition of the used secondary aqueous processing solution 153 including the dispersing agent to the processing solution tank 140, and the removal of a portion of the used aqueous processing solution 143 from the processing solution tank 140 results in lower polymer concentrations and lower ratios of polymer to dispersing agent in the processing solution tank 140. This is believed to reduce the agglomeration of the polymer particles, while maintaining the pH in a desirable range.

The invention has been described in detail with particular reference to certain preferred embodiments thereof, but it will be understood that variations and modifications can be effected within the spirit and scope of the invention.

PARTS LIST 10 mask material
12 mask layer
14 substrate
16 radiation
18 mask image
20 photosensitive printing plate
22 photopolymer layer
24 substrate
26 radiation
28 latent image
29 cross-linked polymer region
30 relief image
100 processing system
101 processing path
102 main processing unit
104 secondary processing unit
105 processing solution removal system
106 rinsing unit
108 drying unit
110 platen
112 pump
114 pump
116 pump
124 exposed portions
126 unexposed portions
128 debris
140 processing solution tank
142 aqueous processing solution
143 used aqueous processing solution
144 collection system
146 conduit
148 filter
150 supply tank
152 secondary aqueous processing solution
153 used secondary aqueous processing solution
154 collection system
156 conduit
160 mechanical cleaning system
162 mechanical cleaning system
170 water
172 air knife
180 holding tank
181 waste processing solution
182 coagulant supply system
184 coagulant
186 coagulated polymer
200 table
210 table
220 table
230 table

The invention claimed is:

1. A method for processing a photosensitive flexographic printing plate having a latent image formed by image-wise exposure of an aqueous-processable photopolymer, comprising:

providing the photosensitive flexographic printing plate having the latent image that has at least one exposed portion with hardened photopolymer and at least one unexposed portion with unhardened photopolymer;

contacting the latent image with a first aqueous processing solution including a first dispersing agent;

mechanically cleaning the latent image in the presence of the first aqueous processing solution;

removing a majority of unhardened photopolymer from the at least one exposed portion with the first aqueous processing solution to form a first used aqueous processing solution having the photopolymer and to form a relief image from the latent image;

washing the relief image with a second aqueous processing solution including a second dispersing agent, the second aqueous processing solution being devoid of the photopolymer;

removing additional unhardened photopolymer from the at least one unexposed portion with the second aqueous processing solution to form a second used aqueous processing solution having the photopolymer;

combining the first used aqueous processing solution with the second used aqueous processing solution to form a combined used aqueous processing solution;

maintaining the combined used aqueous processing solution below a set maximum volume; and maintaining a concentration of the photopolymer in the combined used aqueous processing solution below a set maximum photopolymer concentration, wherein a first latent image is contacted the first aqueous processing solution with or without the photopolymer; and wherein a subsequent latent image is contacted with the combined used aqueous processing solution as the first aqueous processing solution.

2. The method of claim 1, further comprising mechanically cleaning the relief image in the presence of the second aqueous processing solution.

3. The method of claim 1, wherein the first dispersing agent is the same as the second dispersing agent.

4. The method of claim 1, further comprising:
providing a flexographic printing plate precursor having the unhardened photopolymer;
providing a mask to the unhardened photopolymer;
forming the latent image; and
removing the mask to provide the photosensitive flexographic printing plate having the latent image.

5. The method of claim 1, further comprising maintaining the combined used aqueous processing solution within a set pH range.

6. The method of claim 1, further comprising filtering the first used aqueous processing solution and/or the second used aqueous processing solution before forming the combined aqueous processing solution.

7. The method of claim 1, further comprising washing the developed relief image with water after the relief image has been washed with the secondary aqueous processing solution.

8. The method of claim 1, further comprising:
adding a coagulant to the combined used aqueous processing solution to coagulate the photopolymer; and
removing the coagulated photopolymer from the combined used aqueous processing solution.

9. The method of claim 1, further comprising:
maintaining the first aqueous processing solution and combined aqueous processing solution at a temperature between 40° C. to 60° C.; and/or
maintaining the second aqueous processing solution at a temperature between 40° C. to 55° C.

10. The method of claim 1, further comprising processing at least fifty photosensitive flexographic printing plates having the latent images with the combined aqueous processing solution.

11. The method of claim 1, further comprising drying the washed relief image.

12. The method of claim 1, further comprising exposing the washed relief image with UV light.

13. The method of claim 1, further comprising determining a number of debris artifacts on the relief image.

14. The method of claim 1, further comprising:
determining an unacceptable debris artifact on the relief image;
discarding the combined used aqueous processing solution; and
obtaining fresh first aqueous processing solution.

* * * * *